United States Patent [19]

Ueta et al.

[11] Patent Number: 4,894,630

[45] Date of Patent: Jan. 16, 1990

[54] CONVERSION ADAPTER

[75] Inventors: Masamichi Ueta; Yukihiro Kobayashi, both of Osaka, Japan

[73] Assignee: NEC Home Electronics Ltd., Osaka, Japan

[21] Appl. No.: 275,747

[22] Filed: Nov. 23, 1988

[30] Foreign Application Priority Data

Nov. 28, 1987 [JP] Japan ................. 62-181773

[51] Int. Cl.[4] .............................................. H03H 7/01
[52] U.S. Cl. .................................... 333/185; 439/607;
439/620; 333/167; 333/181; 174/50.52
[58] Field of Search .............................. 333/167-168,
333/181-185, 12, 172-181; 174/50, 51, 50.52,
52.1; 439/607, 620

[56] References Cited

U.S. PATENT DOCUMENTS 4,673,237  6/1987  Wadsworth .................. 333/182 X
4,757,282  7/1988  Sakamoto et al. ............ 333/185 X
4,789,847 12/1988  Sakamoto et al. ............ 333/167 X Primary Examiner—Eugene R. Laroche
Assistant Examiner—Seung Ham
Attorney, Agent, or Firm—Cushman, Darby & Cushman

[57] ABSTRACT

A conversion adapter including noise filters for eliminating high frequency noise yet having a simple wiring arrangement. The conversion adapter of the invention has two connectors supported on an adapter frame body and spaced opposite to each other and at a different configuration with respect to each other, a small-sized printed circuit board disposed between the two connectors, a plurality of 3-terminal noise filters arrayed in a row on the central portion of the printed board, and board-in connectors for connecting wires led from the connectors to both sides of the noise filters arranged on the circuit board. Assembly is greatly simplified since the wires from the connectors may be connected to the terminals of the board-in connectors prior to final assembly.

5 Claims, 3 Drawing Sheets

CONVERSION ADAPTER

BACKGROUND OF THE INVENTION

1. Field of the Invention

The present invention relates to a conversion adapter for making a connection between two devices each having signal input/output connectors assuming a different configuration with respect to each other.

2. Description of the Related Art

As illustrated in FIG. 7, a multisync display 1 which is connectable to multiple computers is connected by a connector 1a to a computer 3 having an output connector 3b via connectors 2a of a signal cable 2. The output connector 3b of the computer may have a different configuration than connector 2a, and in this case, the connection is performed typically by interposing a conversion adapter 4 between the connector 2a of the signal cable 2 and the connector 3b of the computer 3. For instance, the connector 1a of the display 1 and the connector 2a of the signal cable 2 are each designed for 9 pins, while the connector 3b of the computer 3 is appropriate for 15 pins. One connector 4a of the adapter 4 thus is designed for 9 pins, while the other connector 4b is suited to 15 pins.

As is known, as the number of connections between the computer and the display increases, the more unnecessary radiation is caused which, in turn, causes more noise which must be strictly regulated. This unnecessary radiation is produced because the signal cable serves as a kind of antenna. A well-known method of eliminating such unnecessary radiation involves a step of inserting noise filters, for cutting off high frequency components by which the unnecessary radiation is caused, in a video signal line in the vicinity of the output of the computer.

Under such circumstances, it has been considered desirable to eliminate such unnecessary radiation by incorporating the above-described noise filters into the conversion adapter 4. Such noise filters are, however, required to have a sharp cut-off property. Hence, each noise filter should be a 3-terminal noise filter of the type depicted in FIG. 6. For this reason, an input/output wire arrangement for the conversion adapter 4 becomes complicated.

In the case of a color display, particularly when there are provided five signal lines (viz., R, G, B, horizontal synchronization and vertical synchronization), for example, the number of noise filters must be increased. This results in a more complicated wire arrangement and renders it quite difficult to incorporate the noise filters into the conversion adapter. Namely, it is quite troublesome to connect a multiplicity of wires led from the input/output connectors of the conversion adapter 4 to predetermined terminals of predetermined noise filters because there are so many portions to be connected. This arrangement is undesirable and unpracticable for use in mass production.

In the conventional conversion adapter having no noise filter, on the other hand, the above-mentioned unnecessary radiation noises cannot be obviated. Therefore, in the example shown in FIG. 7, more than two kinds of signal cables 2 are prepared in which the connector 2a disposed on the side of the computer 3 is suited to 9 pins or 15 pins in order to cope with such a problem. However, the preparation of a plurality of signal cables for this purpose involves a relatively intricate arrangement.

SUMMARY OF THE INVENTION

Accordingly, it is a primary object of the present invention to solve the problems noted above inherent in the prior art by providing a conversion adapter capable of incorporating the noise filters yet allowing for mass production.

For the purpose of obviating the above-mentioned problems, the conversion adapter according to the present invention has two connectors supported on an adapter frame body so as to be spaced opposite to each other, these connector assuming a different configuration with respect to each other; a small-sized printed board disposed between the two connectors; a plurality of 3-terminal noise filters arrayed in a row on the central portion of the printed board; and board-in connectors for connecting wires led from the connectors to both sides of the noise filters on the printed board.

In the process of manufacturing the conversion adapter having the above-described construction, a plurality of noise filters each having three terminals are disposed beforehand on the small-sized printed board, which operation is not especially difficult. In addition, it is also not difficult to connect before final assembly the multiplicity of wires led from the two connectors of the conversion adapter to the predetermined terminals of the board-in connectors because a good number of wires do not interfere with the operation of connecting the two board-in connectors to the printed board when assembling the conversion adapter. Hence, the connecting operation is relatively easy and there is thus less operational difficulty in the process of manufacturing the conversion adapted despite the occurrence of a great number of complicated connectors of the wires.

DESCRIPTION OF THE PREFERRED EMBODIMENTS

One embodiment of the present invention will hereinafter be described with reference to the accompanying drawings. A conversion adapter used in the embodiment corresponds to the conversion adapter 4 depicted in the system of FIG. 7.

Figure 1:
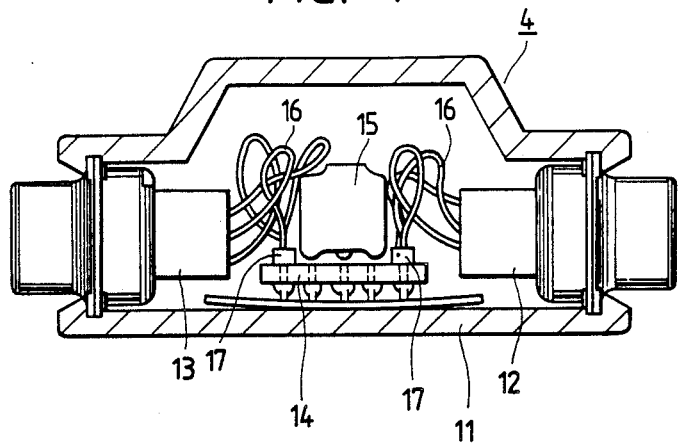
FIG. 1 is a front sectional view of a conversion adapter, illustrating one embodiment of the present invention.
Figure 2:
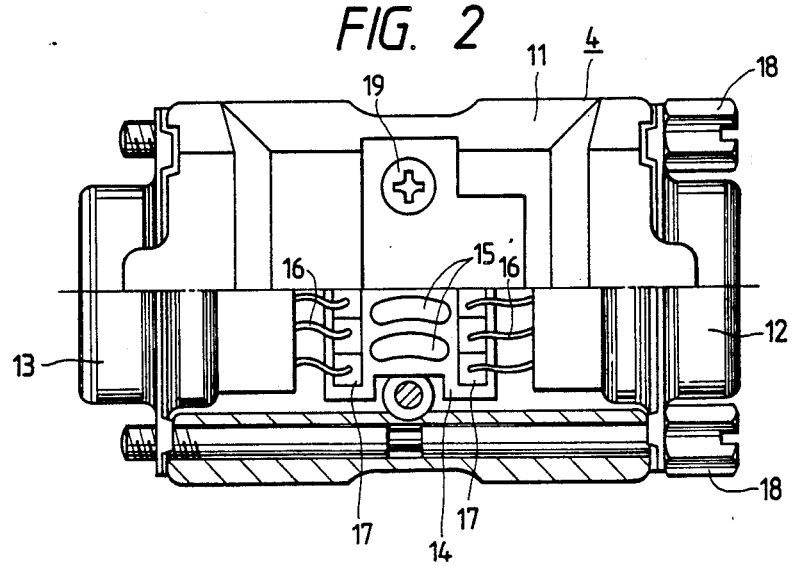
FIG. 2 is a plan view, half in section, of the conversion adapter of FIG. 1.

As illustrated in FIGS. 1 to 4, the conversion adapter 4 (marked with the same numeral as that in FIG. 7) of the present invention has two connectors 12 and 13 supported on an adapter frame body 11 so as to be spaced opposite with respect to each other as shown in FIG. 1. As shown, these connectors also assume a different configuration from each other. The conversion adapter 4 also has a small-sized printed board 14 disposed between the two connectors 12 and 13 and a plurality of 3-terminal noise filters 15 arrayed in a row (i.e., arranged in a row in the longitudinal direction on the sheet as shown in FIG. 2) on the central portion of the printed board 14. Board-in connectors 17 are also provided for connecting wires 16 led from the connectors 12 and 13 to both sides of each noise filter 15 (right and left positions of each noise filter 15 as shown in FIGS. 1 and 2) of the printed board 14.

Figure 3:
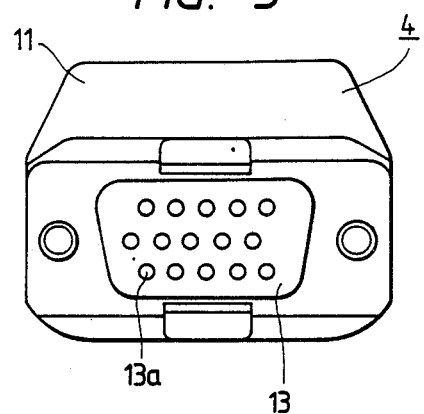
FIG. 3 is a left side view of the adapter of FIG. 1.
Figure 4:
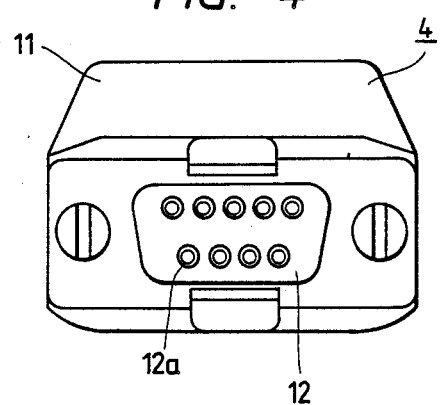
FIG. 4 is a right side view of the adapter of FIG. 1.
Figure 6:
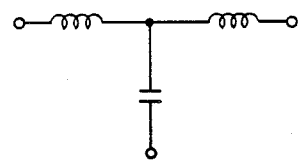
FIG. 6 is a circuit diagram of a prior art noise filter.
Figure 7:
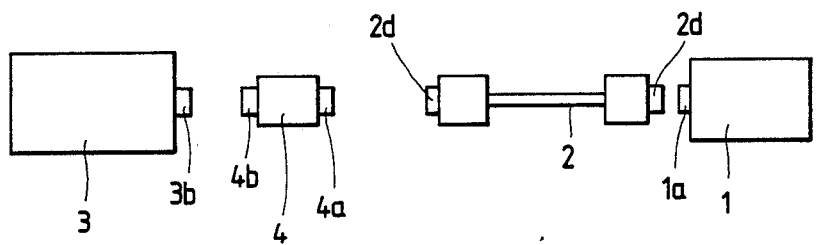
FIG. 7 is an explanatory diagram showing a situation where the conversion adapter according to the present invention may be applied in a prior art arrangement.

As in the case of the connector 2a of the signal cable 2 connected to the multisync display 1 in FIG. 7, the connector 12 of the two connectors 12 and 13 may be formed, for example, with 9 terminals (pin holes) 12a as shown in FIG. 4. Similarly, as with the connector 3b of the computer 3, the other connector 13 may be formed with 15 pins and thus have 15 terminals (pin holes) 13a as shown in FIG. 3. The above-mentioned noise filter 15 may be identical to the 3-terminal noise filter shown in FIG. 6, with the three terminals thereof being inserted into the pin holes formed in the printed board 14 and soldered thereto.

Figure 5:
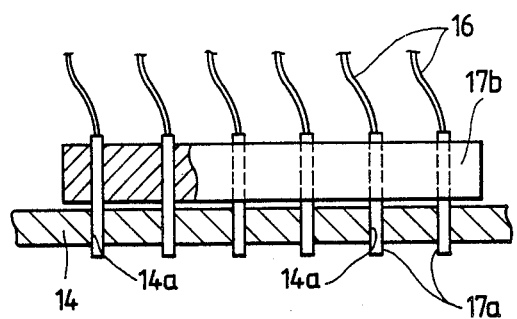
FIG. 5 is a partially enlarged sectional view of the board-in connector.

The board-in connector 17 is, as illustrated in FIG. 5, constructed so that the terminals 17a are arrayed in a row so as to be inserted into the pin holes 14a of the printed board 14 and are molded with a plastic 17b into one united body. The wires 16 led from the connectors 12 or 13 are connected to the respective terminals 17a of the board-in connector 17.

The process of manufacturing the conversion adapter 4 having such a construction now will be explained.

The terminals of each individual noise filter 15 are inserted into the pin holes 14a of the printed board 14 and soldered thereto. The process of incorporating the noise filters before assembly thus can readily be performed, unlike the direct connections of the wires 16 to the terminals of the noise filter as in the prior art. On the other hand, the wires 16 from the connectors 12 and 13 may be respectively connected to the predetermined terminals 17a of the board-in connectors 17. Thus, in addition to the embodiment in which the wires 16 are directly connected to the terminals of the noise filter, this process may also be easily practicable.

Subsequently, the final assembly of the conversion adapter 4 is effected. Board-in connectors 17 are connected to the printed board 14, the wires 16 having already been connected thereto. In this case, the multiplicity of wires 16 led from the connectors 12 and 13 are connected directly to the printed board 14, but this process is very troublesome. In contrast with this, the terminals 17a of the two board-in connectors 17 may be simply inserted into the pin holes 14a of the printed board 14 and soldered thereto, thereby simplifying the arrangement. Therefore, provision of the multiplicity of wires 16 does not become an obstacle, and the operation is also quite simple. Moreover, the time required for the connection can be considerably diminished.

Figure 8:
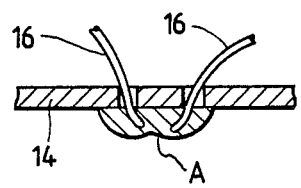
FIG. 8 is an explanatory view depicting a case where a solder-bridge is disadvantageously created in the prior art.

When the wires 16 are inserted directly into the pin holes 14a of the printed board 14 and soldered thereto, as illustrated in FIG. 8, a solder-bridge A may be created depending on the condition under which the wire members (wires 16) are inserted. In the soldering process associated with the board-in connectors 17 of the present invention, however, such a solder-bridge is not produced, thereby preventing a decline in quality.

The connection between the connectors 12 and 13 is thus completed. Next, the adaptor frame body 11 is placed so as to accommodate the components such as the connectors 12 and 13 and the printed board 14 therebetween. The connectors 12 and 13 are then fixed within the adapter frame body 11 and a cover is then fastened with a screw 19. Screws 18 are also provided for fixedly connecting the conversion adapter 4 to a computer body and the signal cable.

The conversion adapter so arranged is capable of preventing the occurrence of unnecessary radiation noises because the noise filters are incorporated therein. Moreover, the incorporation of the noise filters permits the connections of the multiplicity of wires to be extremely simplified within the conversion adapter, and the connecting operation is thereby facilitated. This allows a remarkable reduction in the time needed for the connection. The present invention thus enables conversion adapters having noise filters to be produced by mass production.

In the above-described embodiment, the conversion adapter is employed to make a connection between a display and the computer. However, as would be apparent to one of orinary skill in the art, the conversion adapter can be applied to the connections between other appliances, provided these appliances have signal input/output connectors having different shapes or pin numbers with respect to each other. Such uses of the invention are believed to be apparent to one of ordinary skill in the art and are believed to be included within the scope of the invention defined by the following claims.

What is claimed is:

1. A conversion adapter comprising:
    first and second connectors each including means defining a predetermined number of pin connections on one side thereof and wires electrically connected to said pin connections and extending from another side thereof;
    an adapter frame body for supporting said first and second connectors such that said first and second connectors are spaced from one another and said pin connections of each of said first and second connectors face in directions opposite each other and have different pin connection configurations with respect to each other;
    a printed circuit board disposed between said first and second connectors;
    at least one noise filter arranged on said printed circuit board; and
    board-in connector elements coupled to said wires for connecting said wires from said first and second connectors to said printed circuit board to connect said first and second connectors to respective sides of said at least one noise filter arranged on said printed circuit board.

2. A conversion adapter in accordance with claim 1, wherein said at least one noise filter is a 3-terminal noise filter arranged on the central portion of said printed circuit board such that said wires may be connected to respective sides of said at least one noise filter.

3. A conversion adapter in accordance with claim 1, wherein said first connector has 9 pin connections and said second connector has 15 pin connections.

4. A conversion adapter in accordance with claim 1, wherein a plurality of noise filters are arranged in a row on the central portion of said printed circuit board such that said wires may be connected to respective sides of said noise filters.

5. A conversion adapter in accordance with claim 4, wherein said board-in connector elements have terminals molded into a plastic body and arrayed in a row so as to be connected to the respective sides of said noise filters.

* * * * *